(12) United States Patent
Kang

(10) Patent No.: US 11,488,803 B2
(45) Date of Patent: Nov. 1, 2022

(54) SUBSTRATE PROCESSING APPARATUS

(71) Applicant: Jusung Engineering Co., Ltd., Gwangju-si (KR)

(72) Inventor: Ho Chul Kang, Gwangju-si (KR)

(73) Assignee: Jusung Engineering Co., Ltd., Gwangju-si (KR)

(*) Notice: Subject to any disclaimer, the term of this patent is extended or adjusted under 35 U.S.C. 154(b) by 0 days.

(21) Appl. No.: 17/050,779

(22) PCT Filed: May 3, 2019

(86) PCT No.: PCT/KR2019/005296
§ 371 (c)(1),
(2) Date: Oct. 26, 2020

(87) PCT Pub. No.: WO2019/212270
PCT Pub. Date: Nov. 7, 2019

(65) Prior Publication Data
US 2021/0050182 A1 Feb. 18, 2021

(30) Foreign Application Priority Data

May 3, 2018 (KR) .................. 10-2018-0051196

(51) Int. Cl.
C23C 16/40 (2006.01)
H01J 37/32 (2006.01)
C23C 16/455 (2006.01)

(52) U.S. Cl.
CPC .... *H01J 37/3244* (2013.01); *C23C 16/45536* (2013.01); *C23C 16/45548* (2013.01);
(Continued)

(58) Field of Classification Search
CPC ............. H01J 37/3244; H01J 37/32082; H01J 37/32568; H01J 2237/332;
(Continued)

(56) References Cited

U.S. PATENT DOCUMENTS 7,329,608 B2 * 2/2008 Babayan ................. H01L 23/08
427/535
8,821,641 B2 9/2014 Lee et al.
(Continued)

FOREIGN PATENT DOCUMENTS

CN 103031541 A 4/2013
CN 104380435 A 2/2015
(Continued)

OTHER PUBLICATIONS

Office Action, Taiwanese Patent Application No. 108115361, dated Oct. 12, 2020; 11 pgs.
(Continued)

*Primary Examiner* — Rudy Zervigon
(74) *Attorney, Agent, or Firm* — Andrew D. Fortney; Central California IP Group, P.C.

(57) ABSTRACT

A substrate processing apparatus includes: a gas injection portion including two gas distribution portions, disposed on an upper portion in the chamber and spatially separated from each other, and two types of nozzles, respectively connected to the two gas distribution portions, having different lengths to each other; a first electrode, connected to a radio-frequency (RF) power supply and disposed below the gas injection portion to be vertically spaced apart from the gas injection portion, having a plurality of openings into which among the nozzles, one type of nozzles are respectively inserted; and a second electrode, disposed to oppose the first electrode, mounting a substrate.

3 Claims, 15 Drawing Sheets

(52) U.S. Cl.
CPC .. *C23C 16/45574* (2013.01); *H01J 37/32082* (2013.01); *H01J 37/32568* (2013.01); *H01J 2237/332* (2013.01)

(58) Field of Classification Search
CPC ........ C23C 16/45536; C23C 16/45548; C23C 16/45574; C23C 16/452; C23C 16/45544; C23C 16/45565; C23C 16/5096; C23C 16/505; C23C 16/54; H01L 21/02; H01L 21/67; H01L 21/02274; H01L 21/67017
USPC ....... 118/723 E; 156/345.33, 345.34, 345.43, 156/345.44, 345.45, 345.46, 345.47
See application file for complete search history.

(56) References Cited

U.S. PATENT DOCUMENTS

| | | |
|---|---|---|
| 9,748,077 B2 | 8/2017 | Han et al. |
| 10,504,701 B2 | 12/2019 | Han et al. |
| 2002/0110998 A1 | 8/2002 | Ko et al. |
| 2008/0193673 A1 | 8/2008 | Paterson et al. |
| 2008/0226838 A1 | 9/2008 | Nishimura et al. |
| 2011/0048325 A1* | 3/2011 | Choi ................. C23C 16/45574 118/712 |
| 2012/0045902 A1 | 2/2012 | Fischer et al. |
| 2012/0100309 A1 | 4/2012 | Miyairi et al. |
| 2013/0084391 A1 | 4/2013 | Lee et al. |
| 2013/0084706 A1* | 4/2013 | Zhao ................. H01J 37/32256 257/E21.252 |
| 2014/0007812 A1* | 1/2014 | Chang ............... H01J 37/32541 315/111.21 |
| 2014/0283747 A1* | 9/2014 | Kasai .................. H01J 37/3244 118/723 R |
| 2014/0373783 A1 | 12/2014 | Sawada et al. |
| 2015/0235812 A1 | 8/2015 | Han et al. |
| 2015/0348755 A1* | 12/2015 | Han .................... H01J 37/3244 239/548 |
| 2017/0330733 A1 | 11/2017 | Han et al. |

FOREIGN PATENT DOCUMENTS

| | | |
|---|---|---|
| EP | 3136419 A1 | 3/2017 |
| JP | 2012-107329 A | 6/2012 |
| JP | 2017054943 A | 3/2017 |
| KR | 10-2009-0092257 A | 8/2009 |
| KR | 10-2014-0135202 A | 11/2014 |

OTHER PUBLICATIONS

International Search Report, International Patent Application No. PCT/KR2019/005296 dated Aug. 2, 2019; 6 pgs.; ISA/KR, Korean Intellectual Property Office, Daejeon, Republic of Korea.

Office Action dated Aug. 16, 2022 for Chinese Patent Application No. 201980029687.2; 12 pgs; National Intellectual Property Administration, PRC (CNIPA).

* cited by examiner

SUBSTRATE PROCESSING APPARATUS

CROSS-REFERENCE TO RELATED APPLICATIONS

This application is a continuation of and claims priority to PCT/KR2019/005296 filed on May 3, 2019, which claims priority to Korea Patent Application No. KR 10-2018-0051196 filed on May 3, 2018, the entireties of which are both hereby incorporated by reference.

TECHNICAL FIELD

The present disclosure relates to a substrate processing apparatus and, more particularly, to a substrate processing apparatus in which a first gas and a second gas are supplied to a substrate through different paths, respectively.

BACKGROUND

A substrate processing apparatus according to a related art includes a lower support for supporting a substrate and a first upper electrode vertically spaced apart from the lower support. When radio-frequency (RF) power is applied to the first upper electrode, plasma is generated between the first upper electrode and the lower support. A substrate, disposed on the lower support, is treated with plasma. The plasma may decompose a reactive gas to deposit a thin film on the substrate. A mixed gas, including a plurality of gases provided in a single gas supply unit, is ejected to a plurality of nozzles formed in the first upper electrode. Accordingly, the plurality of nozzles uniformly inject a gas onto the large-area substrate. The first upper electrode serves as not only an injection structure but also an electrode. A large-area layer and layer formation uniformity control effect is provided only by adjusting a shape of a surface of the first upper electrode and a shape of a nozzle. However, large-area layer and layer formation uniformity control is limited due to diffusion characteristic of whole bulk plasma.

Korean Patent Laid-Open Publication No. 10-2014-0084906 discloses an apparatus for processing substrate which has a reactive gas protrusion nozzle and a diluted gas nozzle disposed around the reactive gas protrusion nozzle. However, since the diluted gas nozzle has a small discharge space, it is difficult for the diluted gas nozzle to adjust discharge characteristics.

As demand for large-area flat panel displays has increased in recent years, formation of a high-quality organic layer is required. Also, there is need for atomic layer deposition (ALD), in which a thin film is formed by alternately injecting two gases, for a large-area encapsulation process or an oxide semiconductor deposition process.

SUMMARY

An aspect of the present disclosure is to provide an apparatus in which a first gas and a second gas are respectively discharged in a first space and a second space and radicals, generated by discharge of the first gas in the first space, are provided the second space, in which a substrate is disposed, to improve a deposition rate and thin-film characteristics.

Another aspect of the present disclosure is to provide an apparatus which simultaneously generates direct plasma and remote plasma to improve a thin-film deposition rate and thin-film characteristics.

According to an aspect of the present disclosure, a substrate processing apparatus includes: a gas injection portion including two gas distribution portions, disposed on an upper portion in a chamber and spatially separated from each other, and two types of nozzles, respectively connected to the two gas distribution portions, having different lengths to each other; a first electrode, connected to a radio-frequency (RF) power supply and disposed below the gas injection portion to be vertically spaced apart from the gas injection portion, having a plurality of openings into which among the nozzles, one type of nozzles are respectively inserted; and a second electrode, disposed to oppose the first electrode, mounting a substrate. The gas distribution portion may be grounded.

In an example embodiment, the two gas distribution portions may be separated into a first gas distribution portion, disposed in a space on an upper end of the gas distribution portion, and a second gas distribution portion disposed below the first gas distribution portion. The nozzles may include first nozzles, communicating with a gas buffer space of the first gas distribution portion, and second nozzles communicating with flow paths of the second gas distribution portion.

In an example embodiment, the first nozzles may be disposed to penetrate through protrusions protruding from a bottom surface of the gas distribution portion. The protrusion may be disposed to be inserted into the opening. The second nozzles may be disposed around the protrusion in the gas distribution portion, A gas, injected through the nozzles, may be discharged through the opening of the first electrode after passing through an auxiliary plasma space between the gas distribution portion and the first electrode.

In an example embodiment, each of the two gas distribution portions may separate different types of gases and feed the separated gases, may feed a mixture gas in which a plurality of gases are mixed, or may divide the same type of gas and feed the divided gases at the same time.

In an example embodiment, each of the first nozzles may have an outlet disposed in the opening, disposed on the same position as a bottom surface of the opening, or disposed below the opening through the bottom surface of the opening.

In an example embodiment, lengths or outlet positions of the first nozzles may be different from each other depending on a position of the substrate.

In an example embodiment, the opening of the first electrode may have a tapered shape in which a diameter is gradually increased in a direction of the substrate.

In an example embodiment, the opening of the first electrode may have a cross-sectional shape including a straight-line section to form one or more vertical steps. One or more diameters, different from upper and lower diameters of the opening of the first electrode, may be included in the opening of the first electrode.

In an example embodiment, a cross section or a diameter of the opening of the first electrode may vary depending on a position of a disposition plane.

According to an aspect of the present disclosure, a substrate processing apparatus includes: a first electrode, disposed inside a chamber, receiving radio-frequency (RF) power from an external component and having a plurality of openings two-dimensionally arranged at regular intervals; and a gas injection portion including first nozzles, penetrating through protrusion protruding from a bottom surface to be respectively inserted into the openings, and second nozzles, disposed on the bottom surface around each of the first nozzles, and being disposed on the first electrode to be spaced apart from the first electrode by a constant interval and to form an auxiliary plasma space. The first nozzles inject a first gas. The first nozzle has an external diameter smaller than an internal diameter of the opening of the first electrode. The second nozzles inject a second gas. The second gas, injected through the second nozzles, is injected through the opening of the first electrode after passing through the auxiliary plasma space between the bottom surface of the gas distribution portion and the first electrode. The gas distribution portion is grounded.

In an example embodiment, the gas distribution portion may include a first gas distribution portion and a second gas distribution portion. The second gas distribution portion may include a plurality of first-direction flow paths, disposed on the first electrode, extending parallel to each other in a first direction, and a pair of second-direction flow paths connecting opposite ends of the first-direction flow paths. The first gas distribution portion may be disposed on the second gas distribution portion. A gas buffer space may be provided between a bottom surface of the first gas distribution portion and a top surface of the second gas distribution portion. The openings of the first electrode may be arranged between adjacent first-direction flow paths at regular intervals in the direction. The gas buffer space may be connected to the first nozzles. Each of the first-direction flow paths may be periodically connected to the second nozzles in the first direction.

In an example embodiment, the substrate processing apparatus may further include a gas feeding path penetrating through an edge of the first gas distribution portion to be connected to the second-direction flow path.

In an example embodiment, the substrate processing apparatus may further include an insulating spacer disposed to cover the edge of the first electrode, coupled to a sidewall of the chamber, and inserted between the first gas distribution portion and the second electrode to maintain a constant interval.

In an example embodiment, the substrate processing apparatus may further include a radio-frequency (RF) power supply line vertically penetrating through the gas distribution portion between a pair of adjacent first nozzles aligned in the first direction to be connected to the first electrode and to supply RF power to the first electrode.

In an example embodiment, the opening of the first electrode may have a vertical step, caused by different diameters, or a tapered shape, in which a diameter is gradually increased, as proceeding in a direction of the substrate.

In an example embodiment, a bottom surface of the first nozzle may be lower than a bottom surface of the first electrode and protrudes in a direction of the substrate.

In an example embodiment, an outlet of the first nozzle may increase in diameter as proceeding in a direction of the substrate.

In an example embodiment, the gas distribution portion may include a first gas distribution portion and a second gas distribution portion. The second gas distribution portion may include a plurality of first-direction flow paths, disposed on the first electrode, extending parallel to each other in a first direction, and a pair of second-direction flow paths connecting opposite ends of the first-direction flow paths. The second gas distribution portion may be disposed on the first gas distribution portion. A gas buffer space may be provided between a top surface of the first gas distribution portion and a bottom surface of the second gas distribution portion. The openings of the first electrode may be arranged on the first-direction flow paths at regular intervals. The gas buffer space may be connected to the second nozzles. Each of the first-direction flow paths may be periodically connected to the first nozzles in the first direction.

In an example embodiment, the substrate processing apparatus may further include a gas feeding path penetrating through an edge of the second gas distribution portion to be connected to the second-direction flow path.

In an example embodiment, the first gas distribution portion may further include second-direction auxiliary flow paths, periodically disposed between the second-direction flow paths, and extending parallel to each other in the second direction.

In an example embodiment, a cross section or a diameter of the opening of the first electrode may vary depending on a position of a disposition plane.

In an example embodiment, a bottom surface of the first nozzle may vary depending on a position of a disposition plane.

In an example embodiment, the substrate processing apparatus may further include a second electrode, disposed to oppose the first electrode, mounting a substrate.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

According to an example embodiment of the present disclosure, a gas injection portion, allowing two gases to be injected simultaneously or alternately, is included to provide formation of a large-area high-quality layer. The gas injection portion may include a first gas distribution portion for distributing a first gas, a first nozzle for injecting the first gas, a second gas distribution portion for decomposing a second gas, and a second nozzle for injecting the second gas. The first electrode is disposed to be spaced apart from a bottom surface of the gas injection portion, and includes an opening in which the protruding first nozzle may be inserted.

According to an example embodiment of the present disclosure, an auxiliary plasma space is formed between a first electrode and a gas injection portion disposed on the first electrode, and a main plasma space is formed between the first electrode and a second electrode on which a substrate is mounted. The second nozzle injects a second gas into the auxiliary plasma space to form auxiliary plasma, and the first nozzle injects a first gas into the main plasma space to form main plasma. The first nozzle supplies the first gas to the main plasma space, and the second nozzle supplies the second gas to the auxiliary plasma space. Accordingly, a substrate processing apparatus may control local plasma generation efficiency using the gas injection portion to improve substrate processing characteristics. More specifically, if height of the second electrode is adjusted, a ratio of the auxiliary plasma, indirect plasma, and the main plasma, direct plasma, may be adjusted. Accordingly, the substrate processing apparatus according to the present disclosure may secure both a thin-film growth rate and film quality in a plasma assisted atomic layer deposition process.

Embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
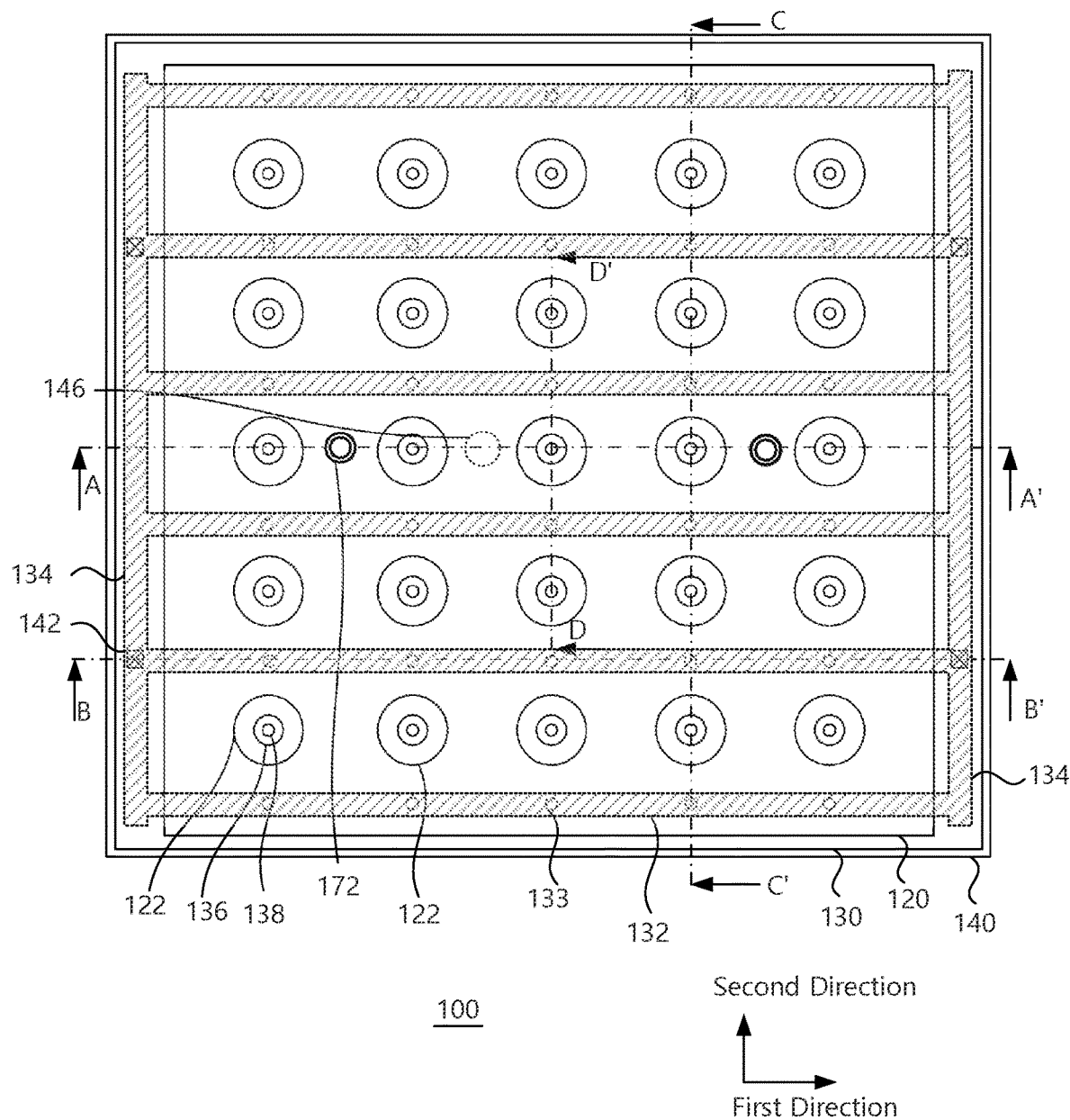
FIG. 1 is a plan view of a substrate processing apparatus according to an example embodiment of the present disclosure.

FIG. 1 is a plan view of a substrate processing apparatus according to an example embodiment of the present disclosure.

Figure 2:
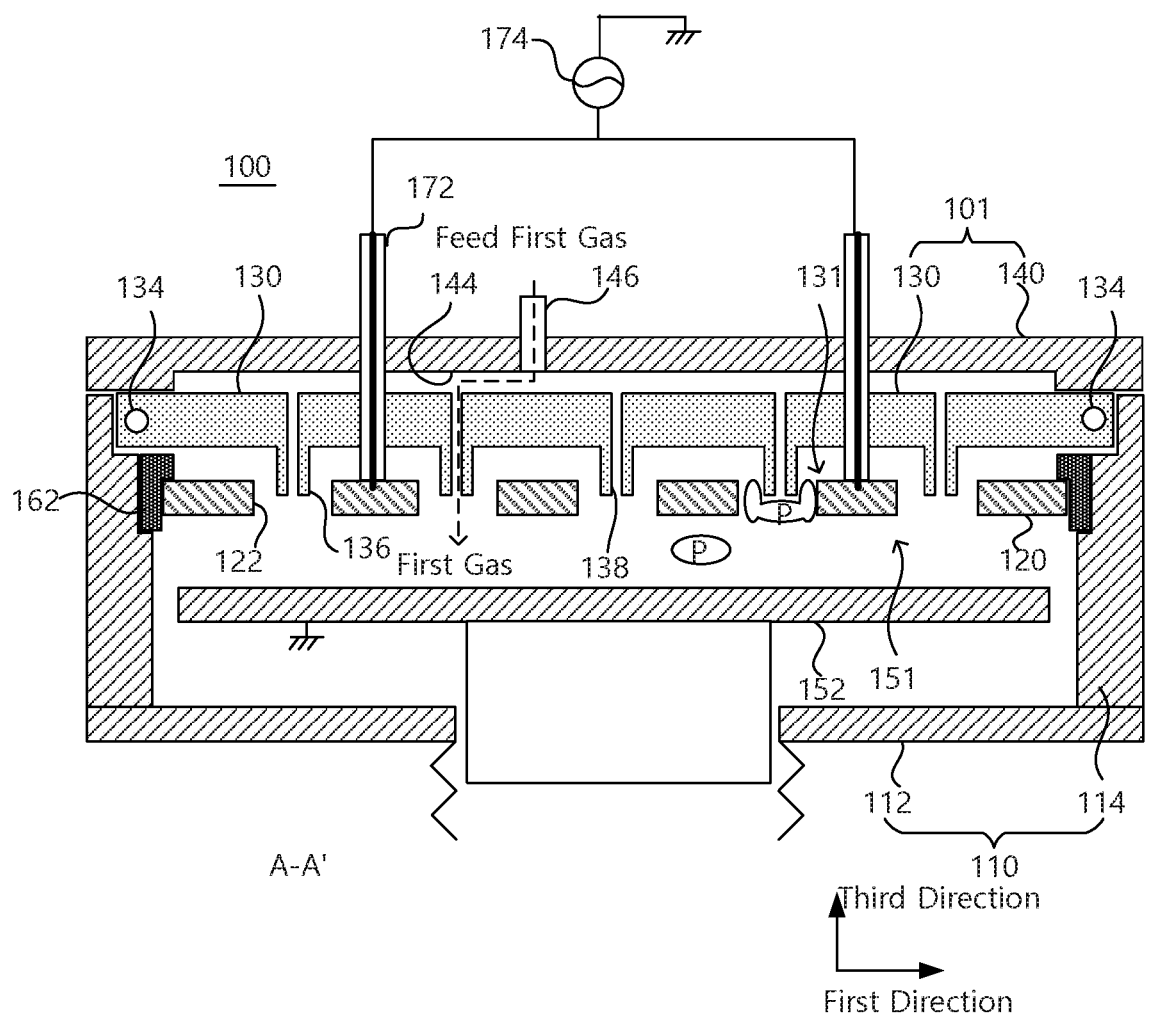
FIG. 2 is a cross-sectional view taken along line A-A' in FIG. 1.

FIG. 2 is a cross-sectional view taken along line A-A' in FIG. 1.

Figure 3:
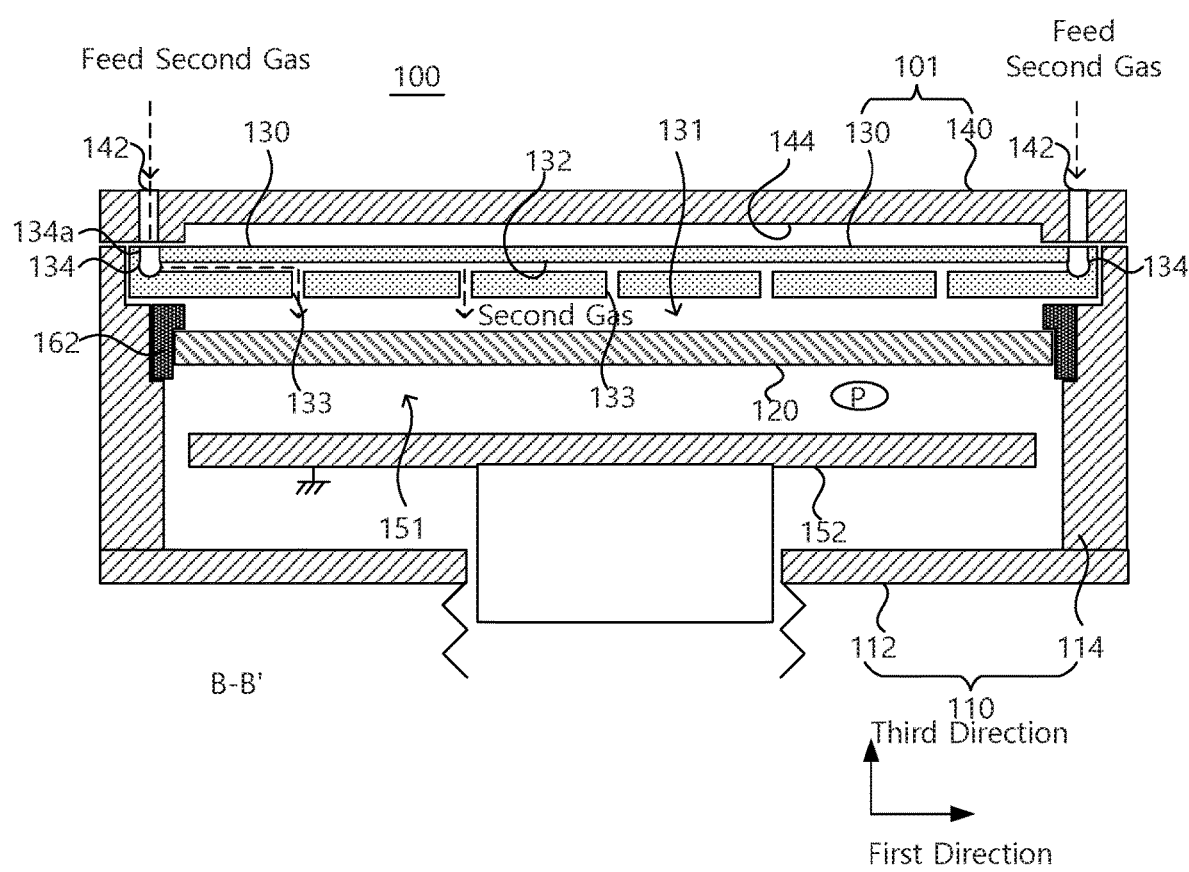
FIG. 3 is a cross-sectional view taken along line B-B' in FIG. 1.

FIG. 3 is a cross-sectional view taken along line B-B' in FIG. 1.

Figure 4:
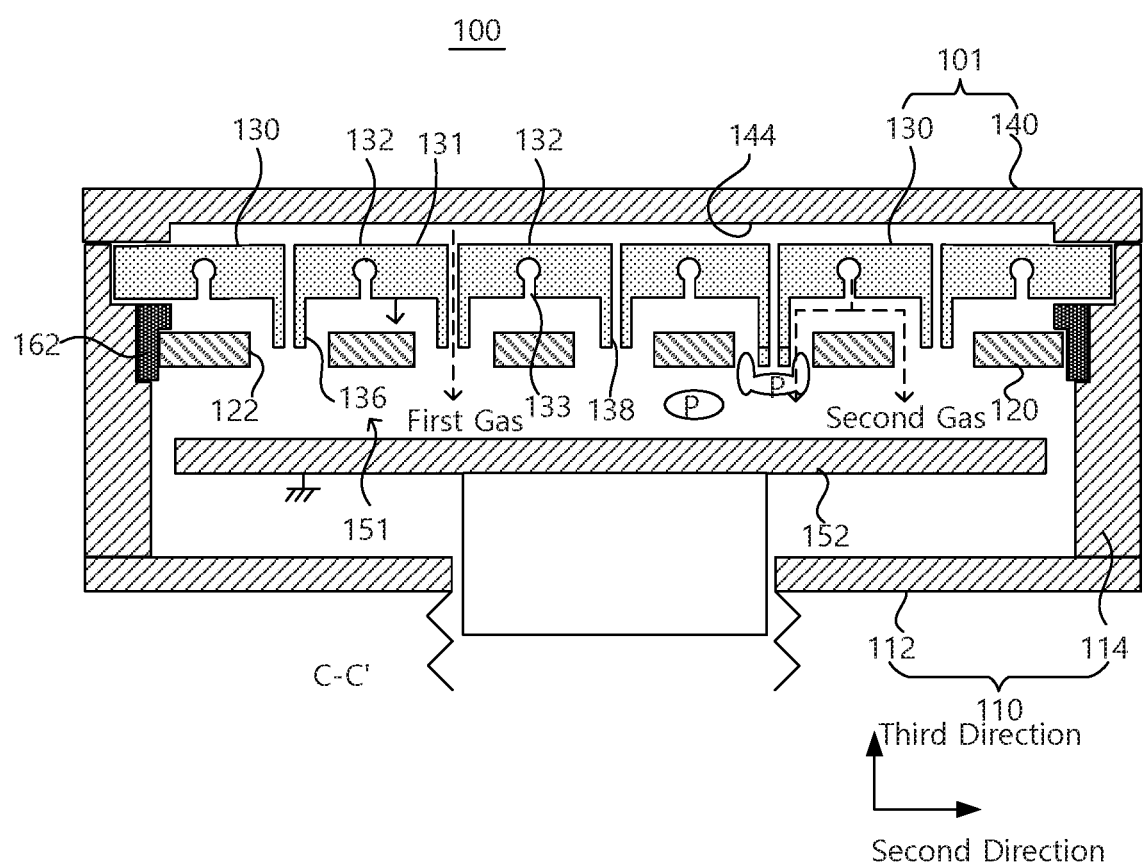
FIG. 4 is a cross-sectional view taken along line C-C' in FIG. 1.

FIG. 4 is a cross-sectional view taken along line C-C' in FIG. 1.

Figure 5:
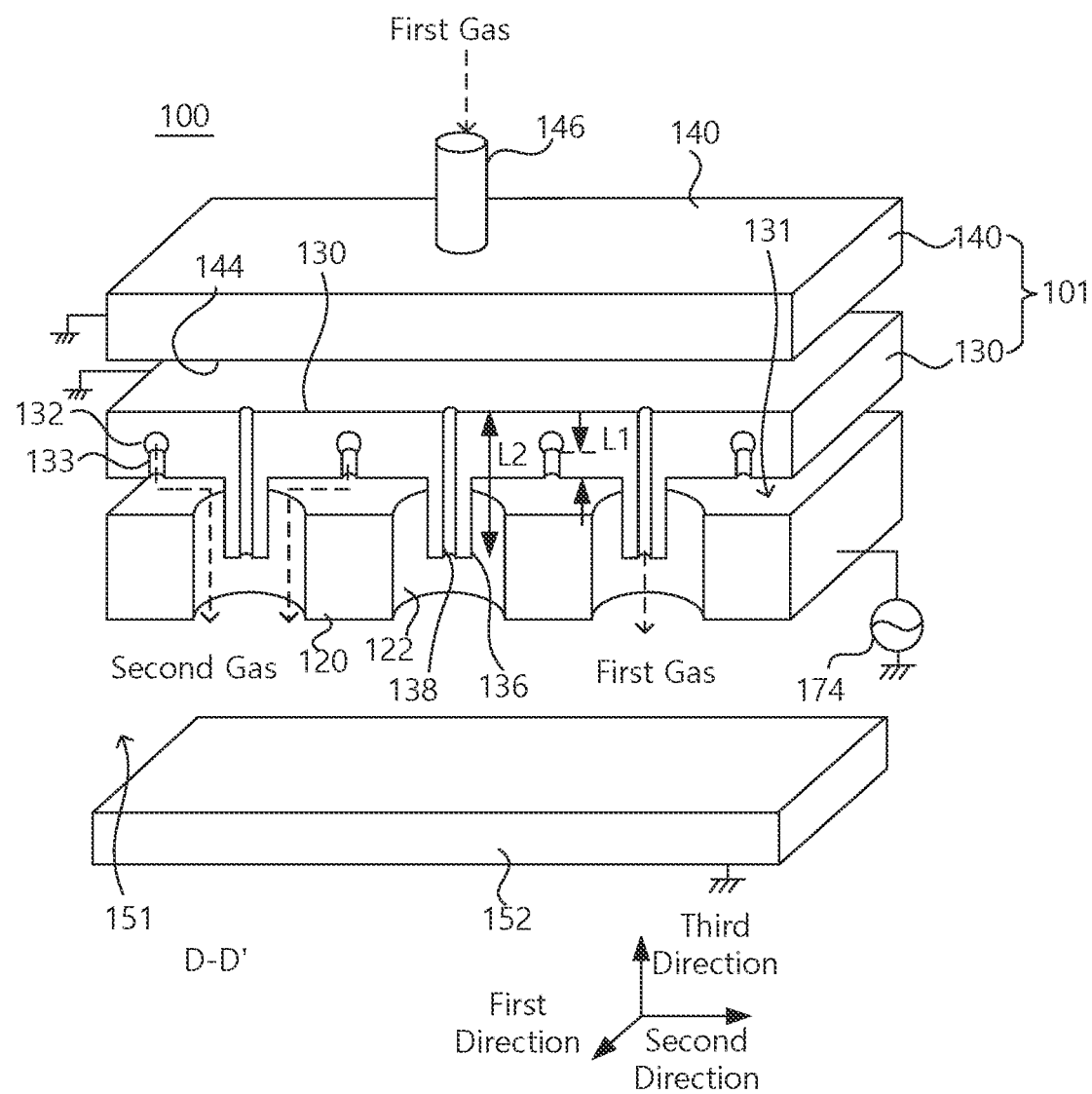
FIG. 5 is a cutaway perspective view taken along line D-D' in FIG. 1.

FIG. 5 is a cutaway perspective view taken along line D-D' in FIG. 1.

Referring to FIGS. 1 to 5, a substrate processing apparatus 100 according to an example embodiment includes a first electrode 120 and a gas injection portion 101. The first electrode 120 is disposed inside a chamber 110, receives radio-frequency (RF) power from an external component, and includes a plurality of openings 122 two-dimensionally arranged at regular intervals.

The gas injection portion 101 includes first nozzles 138, penetrating through protrusions 136, protruding from a bottom surface, to be respectively inserted into the openings 122 of the first electrode 120, and second nozzles 133 disposed on the bottom surface around the respective first nozzles 138. The gas injection portion 101 is disposed over the first electrode 120 and vertically spaced apart from the first electrode 120 by a certain distance to form an auxiliary plasma space 131. The first nozzles 138 inject a first gas, and each of the protrusions 136 has an external diameter smaller than an internal diameter of each of the openings 122 of the first electrode 120. The second nozzles 133 inject a second gas, and the second gas, injected from the second nozzles 133, are injected through the openings 122 of the first electrode 120 after passing through the auxiliary plasma space 131 between a bottom surface of the gas injection portion 101 and a top surface of the first electrode 120.

The substrate processing apparatus 100 may perform atomic layer deposition (ALD) using the first gas, supplied to the first nozzle 136, and the second gas supplied to the second nozzle 133. The ALD may be performed with the assist of plasma. If a plasma technology is applied to the ALD, reactivity of an ALD reactor may be improved, a process temperature range may be extended, and purge time may be reduced. In a plasma-assisted ALD process, precursors are sequentially provided. After the precursors are pursed using a purge gas, a reactor is provided by plasma. The purge gas may be supplied. The providing the reactor by the plasma may increase reactivity of the precursor to improve layer formation speed and to decrease a temperature of a substrate.

The chamber 10 may be a metal chamber and a cylindrical chamber or a rectangular chamber. The gas injection portion 101 may serve as a cover of the chamber 110. The chamber 110 may be exhausted in a vacuum state by an exhausting portion.

For plasma-assisted ALD, a plasma type is classified into a direct plasma type, in which plasma is directly generated on a substrate, and a remote plasma type in which only radicals, generated by plasma, are provided to a substrate. Since the direct plasma type may provide a large amount of radicals, a thin-film growth rate may be increased but a layer may be damaged by direct exposure of plasma. On the other hand, the remote plasma type may form a high-quality thin film but has a low thin-film growth rate.

A substrate processing apparatus according to an example embodiment may achieve both a high thin-film growth rate and a high-quality thin film by simultaneously using a direct plasma type and an indirect plasma type and appropriately adjusting a ratio of the direct plasma type and the indirect plasma type. A radical migration distance may be significantly reduced by shortening a distance between a location, in which the directly plasma is generated, and the substrate.

When the second electrode 152, on which a substrate is mounted, is grounded, the gas injection portion 101 is grounded, and RF power is supplied to the first electrode 120, a main plasma space 151 is formed between the first electrode 120 and the second electrode 152. Auxiliary plasma, generated in the auxiliary plasma space 131, is not directly exposed to the substrate. Density of main plasma, generated in the main plasma space 151, and density of auxiliary plasma, generated in the auxiliary plasma space 131, depend on a gap "b" between a bottom surface of the first electrode 120 and a top surface of the second electrode 152 and a gap "a" between a top surface of the first electrode 120 and a bottom surface of the gas injection portion 101, respectively. The gas injection portion 101, the first electrode 120, and the second electrode 152 may be modeled as a capacitor. Since the top surface of the first electrode 120 may have an area substantially equal to an area of the bottom surface of the gas injection portion 101, a large grounded area may be secured. Accordingly, the auxiliary plasma space 131 may stably generate plasma. The gap "a" between the top surface of the first electrode 120 and the bottom surface of the gas injection portion 101 may be several millimeters to several tens of millimeters such that the auxiliary plasma may be generated in the auxiliary plasma space 131. A ratio of power, consumed in the main plasma space 151, and power, consumed in the auxiliary plasma space 131, may be adjusted by adjusting a height of the second electrode 152. More specifically, when a<b, plasma may be mainly generated in the auxiliary plasma space 131 with high capacity.

Accordingly, for plasmas-assisted ALD, a ratio of direct plasma and indirect plasma may be controlled by adjusting the height of the second electrode 152. In addition, parasitic plasma may be generated in the opening 122 of the first electrode 129. The parasitic plasma may depend on a difference between an internal radius of the opening 122 and an external radius of the protrusion 136. When the difference a difference between an internal radius of the opening 122 and an external radius of the protrusion 136 is less than or equal to a plasma sheath, efficient plasma generation ay be inhibited. More specifically, the difference between an internal radius of the opening 122 and an external radius of the protrusion 136 may be within several millimeters. The difference between an internal radius of the opening 122 and an external radius of the protrusion 136 may be smaller than the gap "a" between a top surface of the first electrode 120 and a bottom surface of the gas injection portion 101.

The second electrode 152 may include heating and cooling means for supporting a substrate and heating or cooling the substrate to a certain temperature. The second electrode 152 may include height adjusting means to change a disposition plane. The second electrode 152 may be disposed opposing the first electrode 120 and may mount a substrate. The second electrode 152 may be grounded.

An RF power supply 174 may generate plasma in the auxiliary plasma space 131 and the main plasma space 151. The RF power supply 174 may supply FR power to the first electrode 120 through an impedance matching network, not illustrated, and an RF power supply line 172. The first electrode 120 may generate capacitively-coupled plasma in both the auxiliary plasma space 131 and the main plasma space 151.

The gas injection portion 101 may inject the first gas through the first nozzle 136 and the second gas through the second nozzle 133, and may serve as a cover of the chamber 110. The first gas may be a precursor gas. The first gas, injected through the first nozzle 136, may be, for example, tri-methyl aluminum (TMA), $TiCl_4$, $HfCl_4$, or $SiH_4$. The second gas, injected from the second nozzle 133, may include at least one of $H_2$, $N_2$, $O_2$, $NH_3$, Ar, and He.

For example, a plasma-assisted ALD process includes first to fourth steps. In the first step, the gas injection portion 101 injects a first gas (for example, a precursor gas such as TMA) through the first nozzle 136. In the second step, a purge gas (for example, an argon gas) is injected through the first nozzle 136 and/or the second nozzle 133. In the third step, RF power is supplied to the first electrode 120, while feeding a second gas (for example, a reactive gas such as oxygen), to generate auxiliary plasma and main plasma. In the fourth step, a purge gas (for example, an argon gas) is injected through the first nozzle 136 and/or the second nozzle 133. The first to fourth steps are repeated.

According to a modified embodiment, the substrate processing apparatus may deposit a thin film using a chemical vapor deposition (CVD) in addition to the plasma-assisted ALD.

The gas injection portion 101 may include a first gas distribution portion 140 and a second gas distribution portion 130. The second gas distribution portion 140 may include a plurality of first-direction flow paths 132, disposed on the first electrode 120, extending parallel to each other in a first direction, and a pair of second-direction flow paths 134 extending in a second direction perpendicular to the first direction and respectively connecting both ends of the first-direction flow paths 132. The second gas distribution portion 140 may be formed of a conductive material and may be electrically grounded or floated.

The first gas distribution portion 140 may be disposed on the second gas distribution portion 130. A gas buffer space 144 may be provided between a bottom surface of the first gas distribution portion 140 and a top surface of the second gas distribution portion 130. The openings 122 of the first electrode 120 may be arranged between adjacent first-direction flow paths 132 at regular interval. The gas buffer space 144 may vertically penetrate through the second gas distribution portion 130 to be connected to the first nozzles 138. Each of the first-direction flow paths 132 may be connected to the second nozzles 133 periodically arranged in the first direction. The second nozzle 133 may vertically penetrate through the second gas distribution portion 130.

The first gas distribution portion 140 may be in the form of a plate shape and may have a bottom surface provided with a recessed portion. The top surface of the second gas distribution portion 130 and the bottom surface of the first gas distribution portion 140 may coupled to each other to provide the gas buffer space 144 formed by the recessed portion. The gas buffer space 144 may uniformly distribute a gas to the first nozzles 138. In order to provide a first gas distribution onto the substrate, an internal diameter of a through-hole 138, constituting the first nozzle 136 may be set to be small in a central portion of the substrate and to be large in an edge portion of the substrate. The first gas distribution portion 140 may be formed of a conductive material and be electrically grounded. The gas distribution portion 140 may serve as a cover of the chamber 110.

The second gas distribution portion 130 may be in the form of a plate and may include a plurality of first-direction flow paths 132 extending parallel to each other in the first direction. The first-direction flow paths 132 may have regular intervals. The plurality of first nozzles 136 and the openings 122 may be arranged between adjacent first-direction flow paths 132 in the first direction. A pair of second-direction flow paths 134 may be disposed on outermost portions of opposite ends of the first-direction flow paths 132 to feed the second gas to the first-direction flow paths 132. The second-direction flow path 134 may extend in the second direction, perpendicular to the first direction, and may connect all one ends of the first-direction paths 132. The second gas distribution portion 130 may be coupled to the chamber 110 by being inserted into an elevated portion formed on an upper internal side of a sidewall 114 of the chamber 110. An bottom surface of an edge of the first gas distribution portion 140 is disposed to cover an edge of the second gas distribution portion 130 and may be coupled to a sidewall 114 of the chamber 110. The second gas distribution portion 130 may be electrically grounded or floated. In detail, the second gas distribution portion 130 may be grounded.

A gas supply path 142 may vertically penetrate through the edge of the first gas distribution portion 140 to be connected to the second-direction flow path 134. An auxiliary hole 134a may be disposed on the edge of the second gas distribution portion 130 to connect the gas supply path 142 and the second-direction flow path 134 to each other. The gas flow path 142 may be provided in plurality.

An insulating spacer 162 may be inserted between the second gas distribution portion 130 and the first electrode 120. In addition, the insulating spacer 162 may be based on ceramic such as alumina, or plastic. The insulating spacer 162 is disposed to cover the edge of the first electrode 120 and may be coupled to the sidewall 114 of the chamber 110. The insulating spacer 162 may form the auxiliary plasma space 131 in an entire region except for a portion in which the first nozzles 138, two-dimensionally protruding, are disposed.

The RF power supply line 172 may vertically penetrating through the gas injection portion 101 between a pair of adjacent first nozzles 138, aligned in the first direction, to be connected to the first electrode 120 and to supply the RF power to the first electrode 120. The RF power supply line 172 may be disposed so as not to intersect the first-direction flow paths 132. The RF power supply line 172 may be a coaxial cable structure to have constant specific impedance. The RF power supply line 172 may include an internal conductive line, an insulating layer cover the insulating layer, and an external conductive jacket covering the insulating layer. The external conductive jacket may have one end connected to the gas second gas distribution portion 130.

A substrate processing apparatus according to an example embodiment may perform an atomic layer deposition (ALD) process of an organic or inorganic layer to improve moisture-permeability characteristics in an encapsulation process of a large-area display.

A substrate processing apparatus according to an example embodiment may be applied to a chemical vapor deposition (CVD) apparatus. A source gas such s $SiH_4$ may be injected through a first nozzle, and a diluted gas such as hydrogen, nitrogen, or ammonia may be injected through a second nozzle. The diluted gas may be dissociated from a main plasma space. Thus, a thin film such as silicon may be deposited on a substrate at a low temperature. A length of the first nozzle may be applied to dissociation characteristics of the source gas to control a content of the hydrogen and defective factors of the substrate.

A substrate processing apparatus according to an example embodiment may improve film-quality uniformity, such as position-dependent stress, permeability, or the like, on a large-area substrate.

A substrate processing apparatus according to an example embodiment includes a main plasma space of a first gas, injected from a first nozzle, and an auxiliary plasma space of a second gas injected from a second nozzle. The main plasma space and the auxiliary plasma space are separated from each other, such that a plasma dissociation rate may be adjusted to improve film quality.

Figure 6:
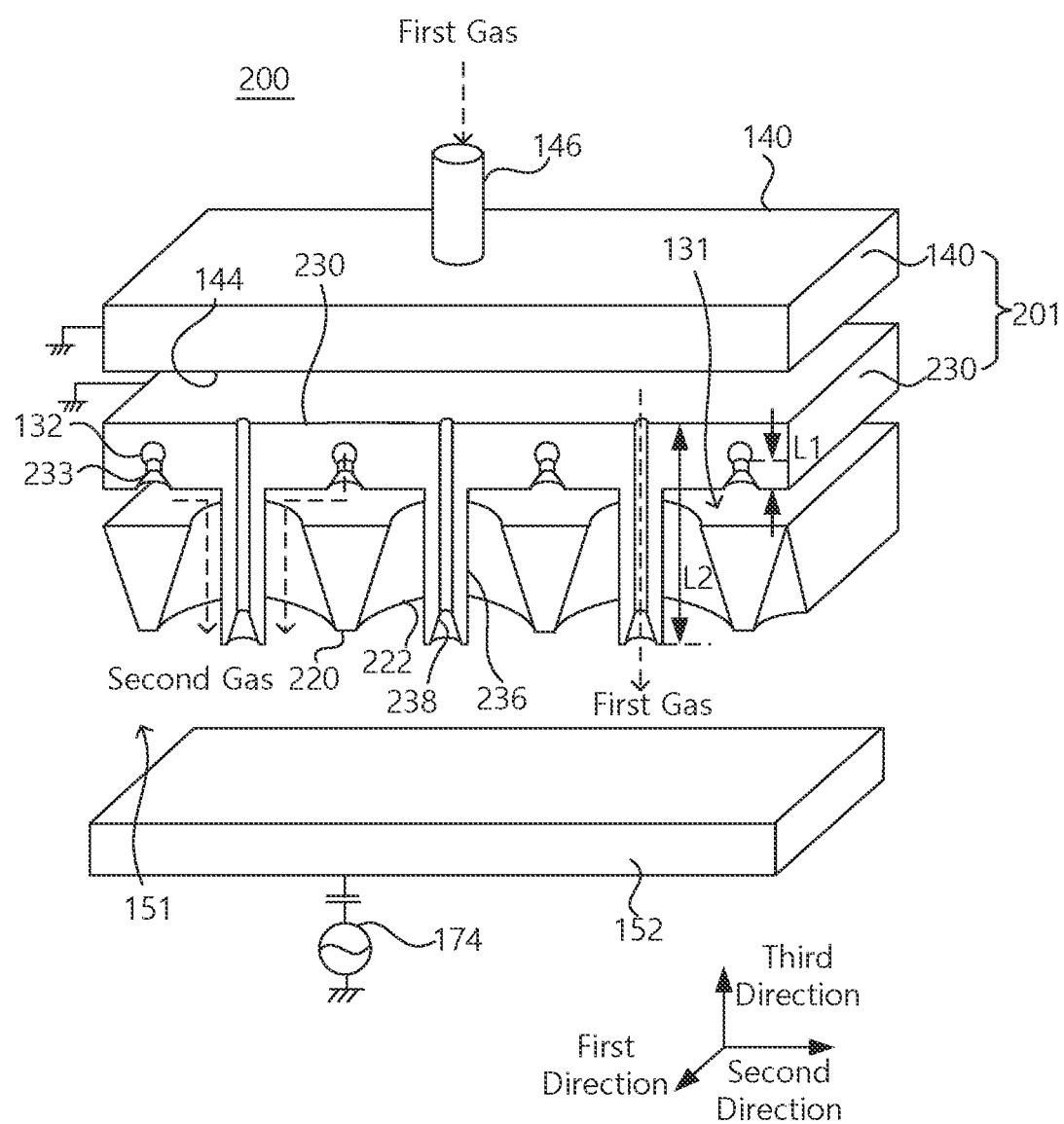
FIG. 6 is a cutaway perspective view illustrating a substrate processing apparatus according to another example embodiment of the present disclosure.

FIG. 6 is a cutaway perspective view illustrating a substrate processing apparatus according to another example embodiment of the present disclosure. The same reference numerals as those of FIGS. 1 to 5 indicate the identical components, and these identical components, which have been described above, will not be repeatedly described.

Referring to FIGS. 1 to 5 and FIG. 6, a substrate processing apparatus 200 according to another example embodiment includes a gas injection portion 201 including two gas distribution portions 140 and 230, disposed on an upper portion in the chamber 110 and spatially separated from each other, and two types of nozzles 233 and 238, respectively connected to the two gas distribution portions 140 and 230, having different lengths to each other, a first electrode 220, connected to a radio-frequency (RF) power supply 174 and disposed below the gas injection portion 201 to be vertically spaced apart from the gas injection portion 201, having a plurality of openings 222 into which among the nozzles 233 and 238, one type of nozzles are respectively inserted, and a second electrode 152, disposed to oppose the first electrode 220, mounting a substrate. The second electrode 152 is grounded.

The two gas distribution portions 140 and 230 are separated into a first gas distribution portion 140, disposed in a space on an upper end of the gas distribution portion 201, and a second gas distribution portion 230 disposed below the first gas distribution portion 140. The nozzles 233 and 238 may include first nozzles 233, communicating with a gas buffer space 144 of the first gas distribution portion 140, and second nozzles 238 communicating with flow paths 132 of the second gas distribution portion 140.

The first nozzles 238 may be disposed to penetrate through protrusions 236 protruding from a bottom surface of the gas distribution portion 101. The protrusion 236 is disposed to be inserted into the opening 222. The second nozzles 233 may be disposed around the protrusion 236 in the gas distribution portion 201. A second gas, injected through the nozzles 233, may be discharged through the opening 222 of the first electrode 220 after passing through an auxiliary plasma space 131 between the gas distribution portion 201 and the first electrode 220. The first nozzle 238 may have a length L1 greater than a length L2 of the second nozzle 233.

The two gas distribution portions 140 and 230 may separate different types of gases and feed the separated gases, may feed a mixture gas in which a plurality of gases are mixed, or may divide the same type of gas and feed the divided gases at the same time.

More specifically, for plasma-assisted atomic layer deposition (ALD), the first nozzle 238 may inject a first gas, containing a precursor, in a precursor feeding step, and the second nozzle 233 may inject a second gas, containing a reactive gas, by generating plasma in a reactive gas feeding step.

For chemical vapor deposition (CVD), a mixed gas, containing a source gas and a diluted gas, may be simultaneously injected through the first nozzle 233 and the second nozzle 238 by generating plasma. Alternatively, the source gas may be injected through the first nozzle 233 and a second gas, containing a diluted gas, may be injected through the second nozzle 238.

Each of the first nozzles 238 may have an outlet disposed in the opening 222, disposed on the same position as a bottom surface of the opening 222, or disposed below the opening 222 through the bottom surface of the opening 222.

A position of the outlet of each of the first nozzles may adjust an injection position of the first gas to adjust dissociation, caused by plasma, in the auxiliary plasma region 131 and a parasitic plasma region in the opening 222. The first gas may be minimally dissociated to participate in a deposition reaction. When the outlet of each of the first nozzles 238 is disposed below the opening 222 through the bottom surface of the opening 222, the first gas may be mainly fed to the main plasma region 151.

The opening 222 of the first electrode 220 may have a tapered shape in which a diameter is gradually increased in a direction of the substrate (or a direction of a second electrode). The tapered shape of the opening 222 may control diffusion in the auxiliary plasma space 131 through the opening 222.

In addition, an outlet of each of the first nozzles 238 may have a tapered shape in which a diameter is gradually increased in the direction of the substrate (or the direction of a second electrode). Accordingly, diffusion of the first gas, injected through the first nozzles, may be controlled.

An outlet of each of the second nozzles 233 may have a tapered shape in which a diameter is gradually increased in the direction of the substrate (or the direction of a second electrode). Accordingly, diffusion of the second gas, injected through the second nozzles, may be controlled in the auxiliary plasma space 131.

When the outlet of the first nozzle 238 is disposed at a lower position than the bottom surface of the first electrode 230, the parasitic plasma, generated in the opening 122 of the first electrode 230, or auxiliary plasma, generated in the auxiliary plasma space, may have higher electron density and higher electron temperature than the main plasma generated in the main plasma space formed below the first electrode 230. Thus, an excessive dissociation reaction of the first gas may be inhibited.

The parasitic plasma, generated in the opening 222 of the first electrode 230, may also be affected by a shape of the opening 222. The shape of the opening 222 may be a cylindrical shape or a tapered shape in which a diameter is gradually increased in a substrate direction. The tapered shape may improve a plasma space distribution by plasma diffusion, or a deposition rate space distribution.

Figure 7:
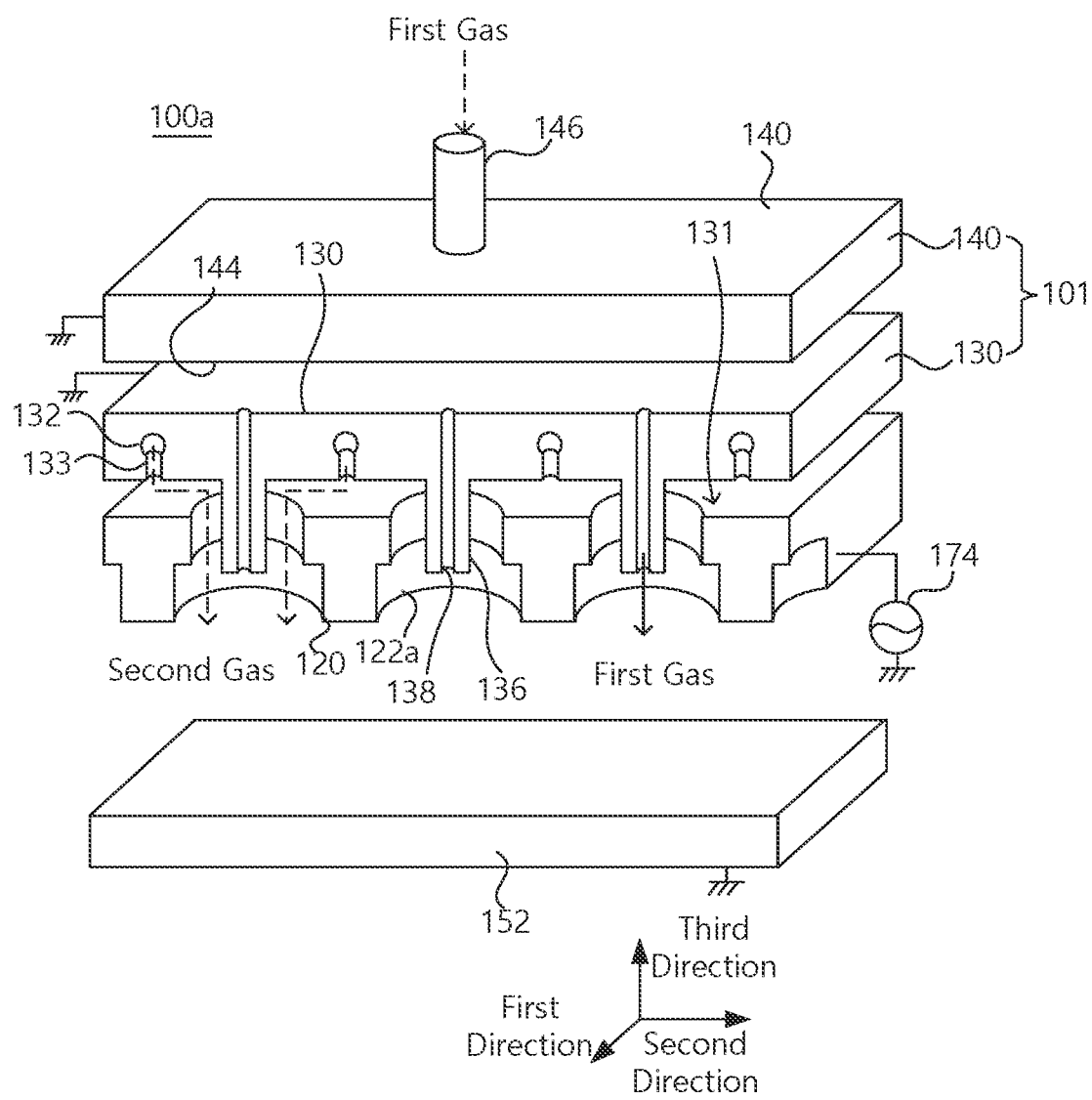
FIG. 7 is a cutaway perspective view illustrating a substrate processing apparatus according to another example embodiment of the present disclosure.

FIG. 7 is a cutaway perspective view illustrating a substrate processing apparatus according to another example embodiment of the present disclosure. The same reference numerals as those of FIGS. 1 to 6 indicate the identical components, and these identical components, which have been described above, will not be repeatedly described.

Referring to FIG. 7, a substrate processing apparatus 100a according to another example includes a gas injection portion 201 including two gas distribution portions 140 and 230, disposed on an upper portion in the chamber 110 and spatially separated from each other, and two types of nozzles 233 and 238, respectively connected to the two gas distribution portions 140 and 230, having different lengths to each other, a first electrode 120, connected to a radio-frequency (RF) power supply 174 and disposed below the gas injection portion 201 to be vertically spaced apart from the gas injection portion 201, having a plurality of openings 122a into which among the nozzles 133 and 138, one type of nozzles are respectively inserted, and a second electrode 152, disposed to oppose the first electrode 120, mounting a substrate. The second electrode 152 is grounded.

When an outlet of a first nozzle 138 is disposed in the opening 122a of the first electrode 130, a first gas may provide a relatively high dissociation rate due to parasitic plasma, generated in the opening 122a of the first electrode 130, and may increase a deposition rate.

A cross-sectional shape of the opening 122a of the first electrode may include a straight-line section to form one or more vertical steps. One or more diameters, different from upper and lower diameters of the opening 122a, may be included in the opening 122a. The lower diameter of the opening 122a may be greater than the upper diameter of the opening 122a, A shape, in which the vertical step is formed, may improve a plasma space distribution by plasma diffusion, or a deposition rate space distribution.

Figure 8:
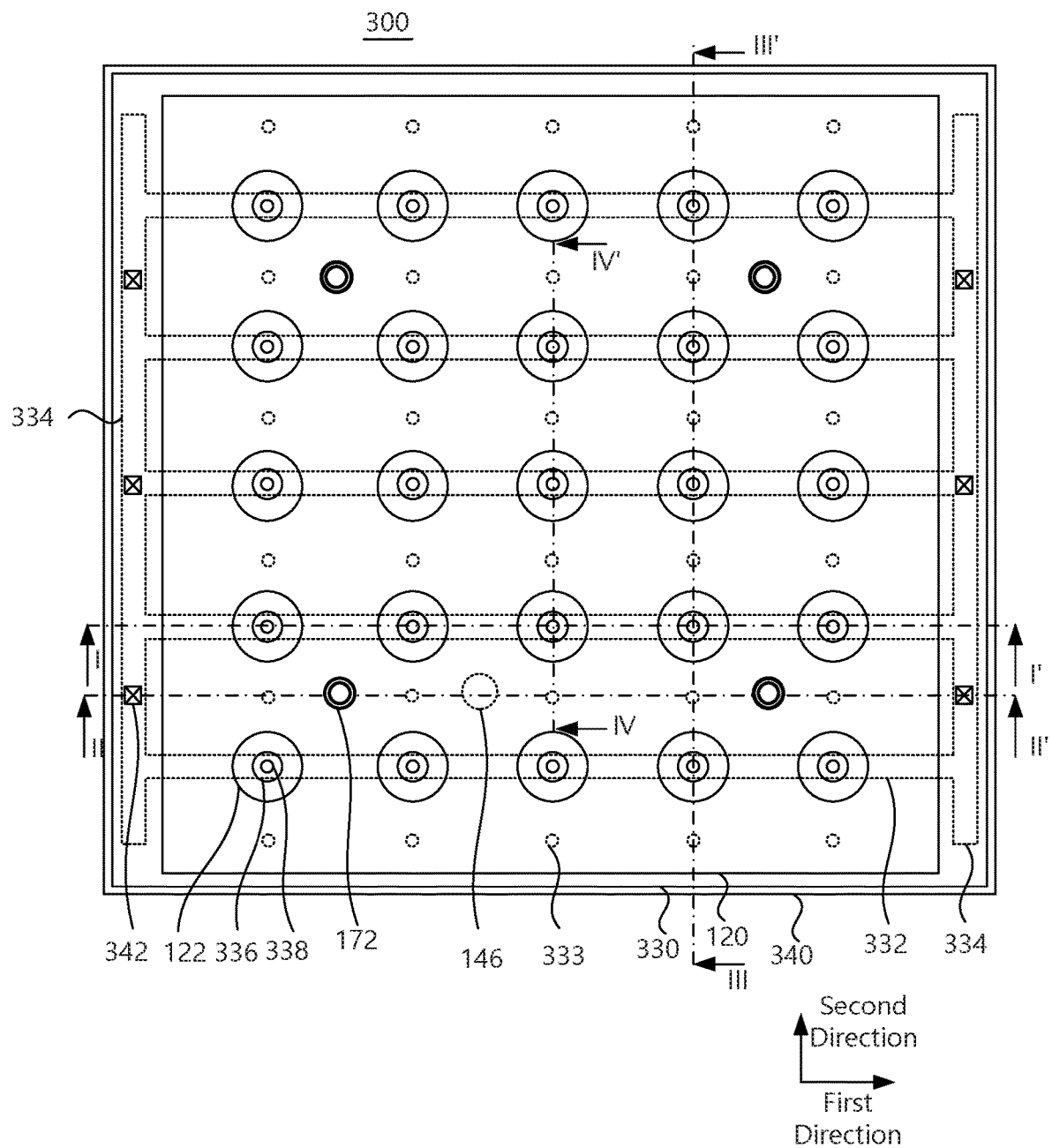
FIG. 8 is a plan view of a substrate processing apparatus according to another example embodiment of the present disclosure.

FIG. 8 is a plan view of a substrate processing apparatus according to another example embodiment of the present disclosure.

Figure 9:
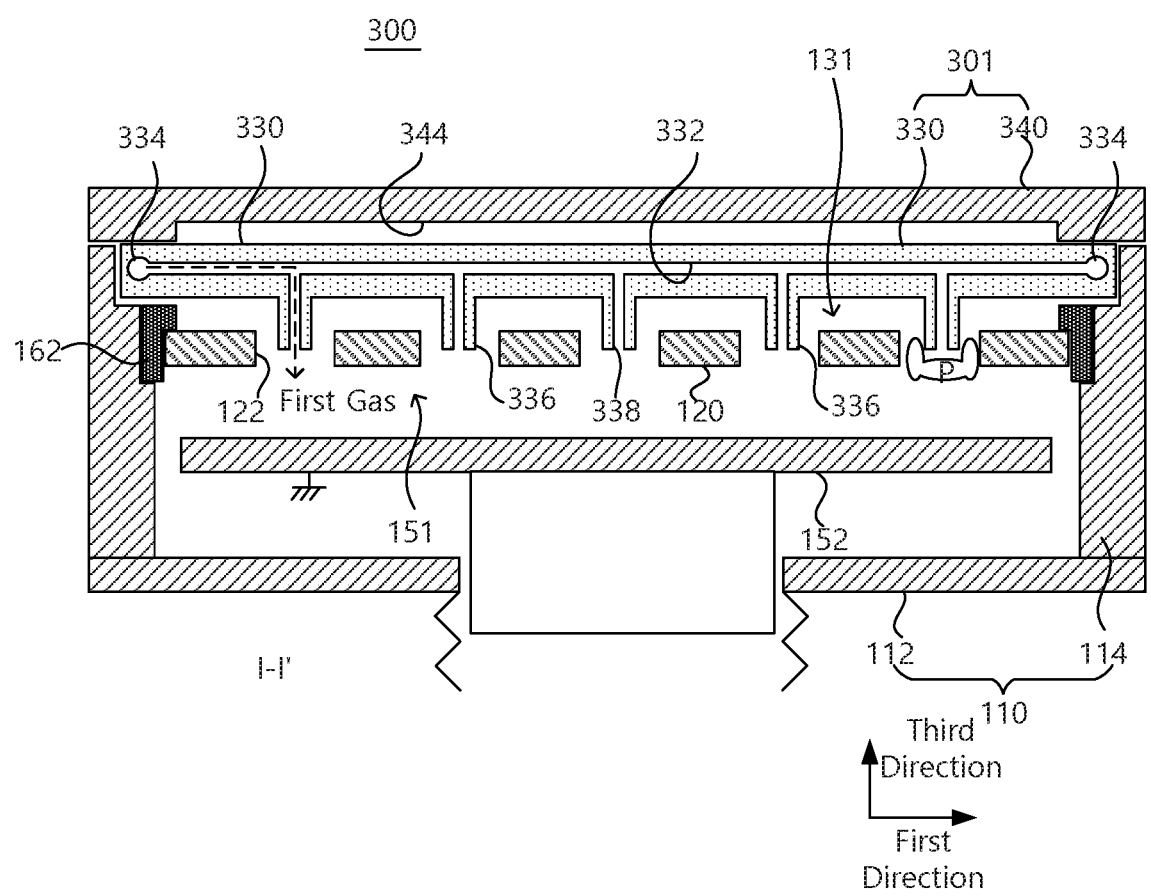
FIG. 9 is a cross-sectional view taken along line I-I' in FIG. 8.

FIG. 9 is a cross-sectional view taken along line I-I' in FIG. 8.

Figure 10:
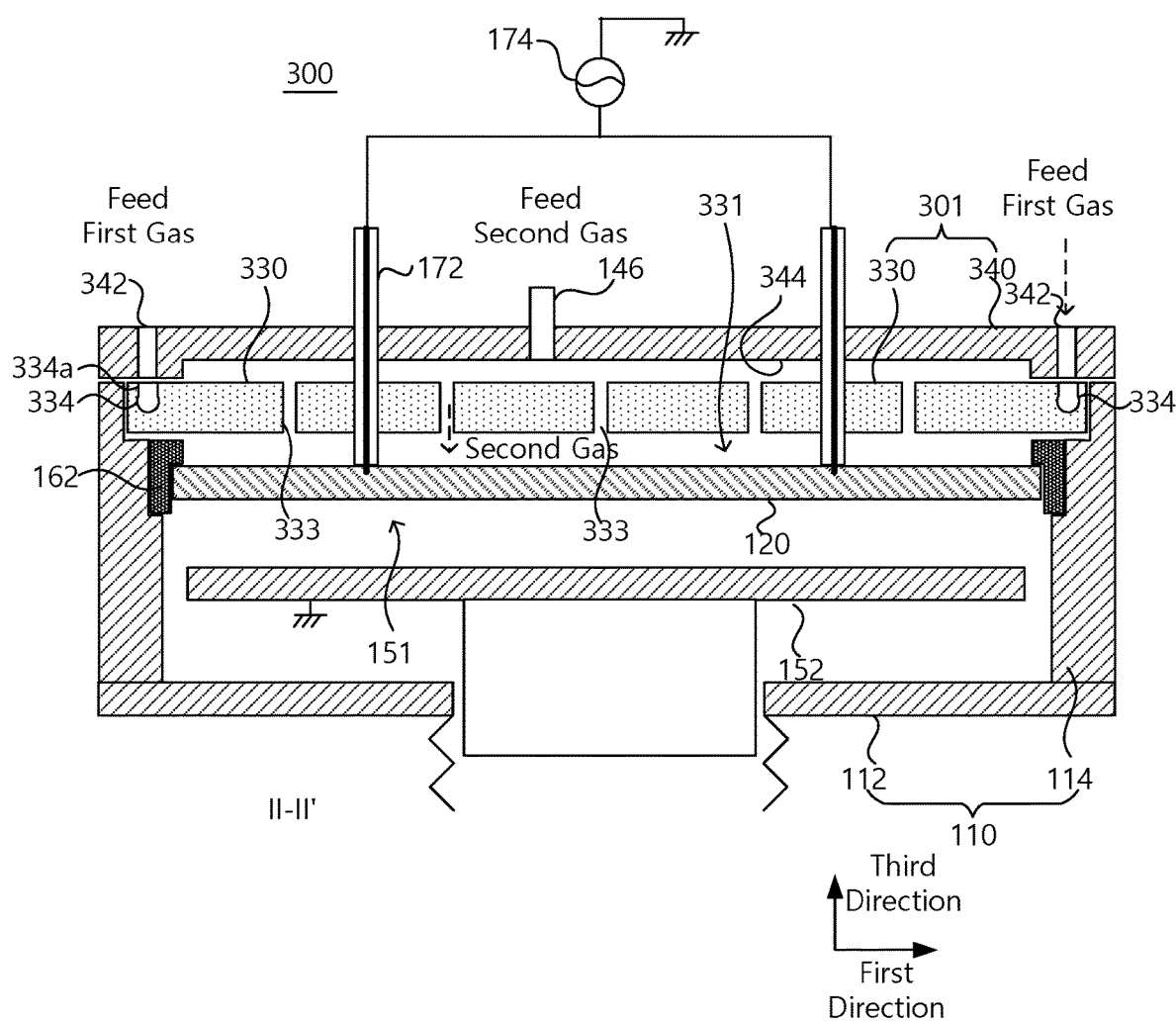
FIG. 10 is a cross-sectional view taken along line II-II' in FIG. 8.

FIG. 10 is a cross-sectional view taken along line II-II' in FIG. 8.

Figure 11:
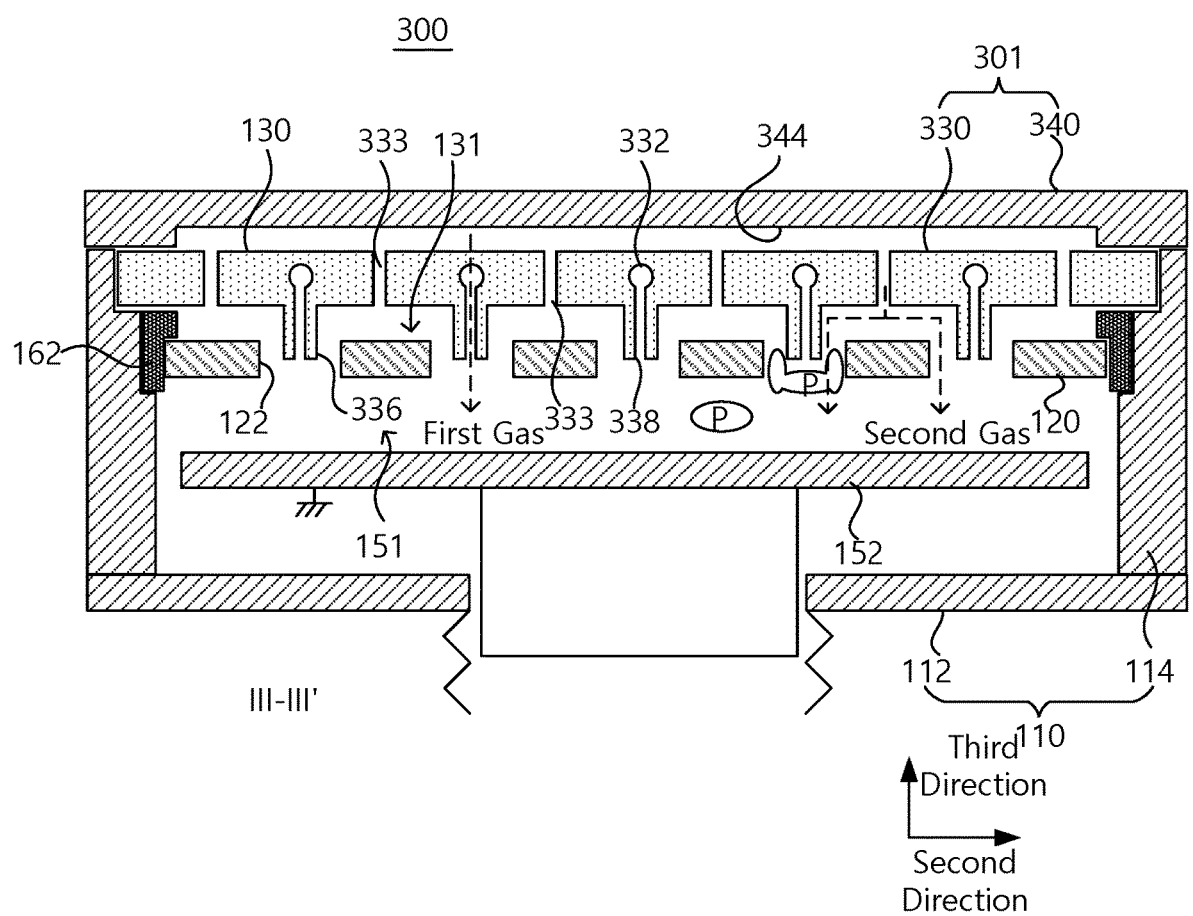
FIG. 11 is a cutaway perspective view taken along line III-III' in FIG. 8.

FIG. 11 is a cutaway perspective view taken along line III-III' in FIG. 8.

Referring to FIGS. 8 to 11, a substrate processing apparatus 300 according to another example embodiment includes a first electrode 120 and a gas distribution portion 301. The first electrode 120 is disposed inside a chamber 110, receives radio-frequency (RF) power from an external component, and has a plurality of openings 122 two-dimensionally arranged at regular intervals.

The gas distribution portion 301 includes first nozzles 338 include first nozzles 338, penetrating through protrusions 336 protruding from a bottom surface to be respectively inserted into the openings 122 of the first electrode 120, and second nozzles 338 disposed on the bottom surface around each of the first nozzles 338. The gas distribution portion 301 may be disposed on the first electrode 120 to be spaced apart from the first electrode 120 by a constant interval and to form an auxiliary plasma space 131. The first nozzles 338 inject a first gas, and the protrusion 336 has an external diameter smaller than an internal diameter of the opening 122. The second nozzles 333 inject a second gas, and the second gas, injected through the second nozzles 333, are injected through the opening 122 of the first electrode 120 after passing through the auxiliary plasma space 331 between the bottom surface of the gas distribution portion 301 and a top surface of the first electrode 120.

The gas distribution portion 301 includes a first gas distribution portion 330 and the second gas distribution portion 340. The first gas distribution portion 330 includes a plurality of first-direction flow paths 332, disposed on the first electrode 120, extending parallel to each other in a direction, and a pair of second-direction flow paths 334 extending in a second direction perpendicular to the first direction and respectively connecting opposite ends of the first-direction flow paths 332.

The second gas distribution portion 340 is disposed on the first gas distribution portion 330. A gas buffer space 344 is provided between a top surface of the first gas distribution portion 330 and a bottom surface of the second gas distribution portion 340. Openings of a first electrode are arranged on the first-direction flow paths at regular intervals. The gas buffer space 144 is connected to the second nozzles 333. The first-direction flow paths 332 are periodically connected to the first nozzles 338 in the first direction, respectively.

A gas feeding path 342 may penetrate through an edge of the second gas distribution portion 340 to be connected to the second-direction flow path 334. An auxiliary hole 334a may be formed on an edge of the first gas distribution portion 330 to connect the gas feeding path 342 and the second-direction flow path 334 to each other.

A radio-frequency (RF) power supply line 172 may vertically penetrate through the gas distribution portion 301 between a pair of adjacent second nozzles 333, arranged in the first direction, to be connected to the first electrode 120 and to supply RF power to the gas distribution portion 301. In a main plasma discharge space 151, plasma may be generated between the first electrode and the second electrode.

Figure 12:
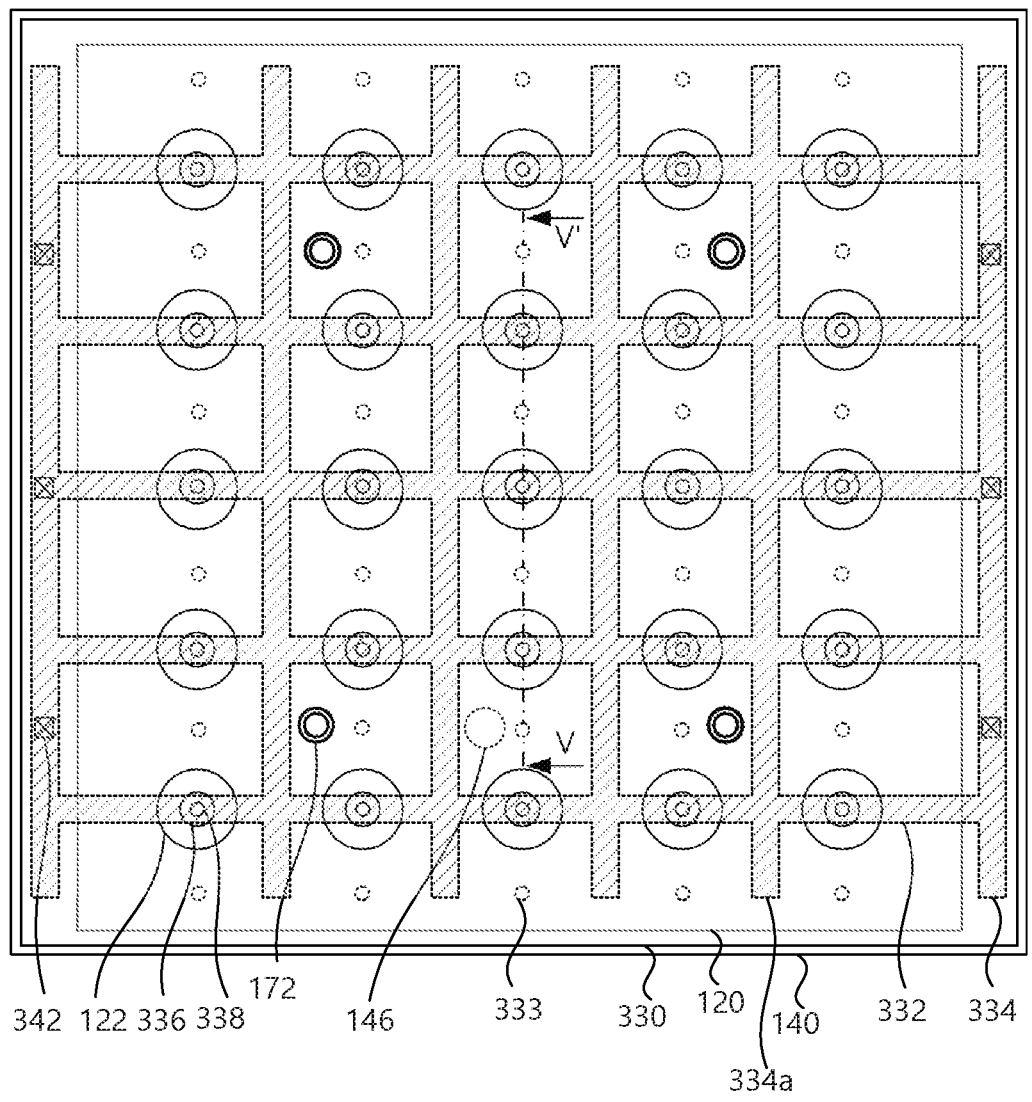
FIG. 12 is a plan view of a substrate processing apparatus according to another example embodiment of the present disclosure.

FIG. 12 is a plan view of a substrate processing apparatus according to another example embodiment of the present disclosure.

Figure 13:
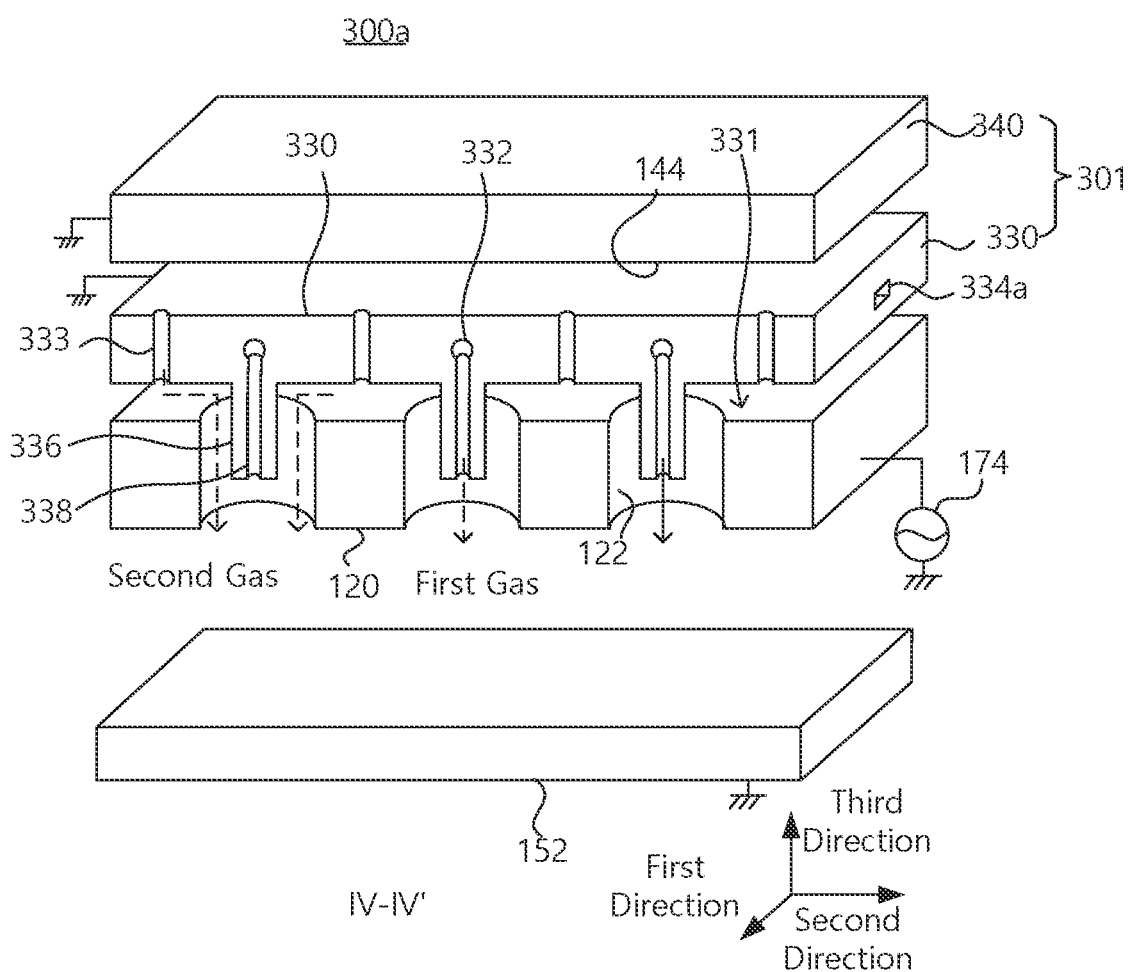
FIG. 13 is a cutaway perspective view taken along line IV-IV' in FIG. 12.

FIG. 13 is a cutaway perspective view taken along line IV-IV' in FIG. 12.

Referring to FIGS. 12 and 13, a substrate processing apparatus 300 according to another example embodiment dudes a first electrode 120 and a gas distribution portion 301. The first electrode 120 is disposed inside a chamber 110, receives radio-frequency (RF) from an external component, and includes a plurality of openings 122 two-dimensionally arranged at regular intervals.

The gas distribution portion 301 includes first nozzles 338, penetrating through protrusions 336 protruding from a bottom surface to be respectively inserted into the opening 122 of the first electrode 120, and second nozzles 333 disposed on the bottom surface around each of the first nozzles 338. The gas distribution portion 301 may be disposed on the first electrode 120 to be spaced apart from the first electrode 120 by a constant interval and to form an auxiliary plasma space 131. The first nozzles 138 inject a first gas, and the protrusion 336 has an external diameter smaller than an internal diameter of the opening 122 of the first electrode 120. The second nozzles 333 inject a second gas, and the second gas, injected through the second nozzles 333, is injected through the opening 122 of the first electrode 120 after passing through the auxiliary plasma space 331 between the bottom surface of the gas distribution portion 301 and a top surface of the first electrode 120.

The gas distribution portion 301 includes a first gas distribution portion 33 and a second distribution portion 340. The first gas distribution portion 330 includes a plurality of first-direction flow paths 332, disposed on the first electrode 120, extending parallel to each other in a first direction, and a pair of second-direction flow paths 334 respectively connecting opposite ends of the first-direction flow paths 332.

The first gas distribution portion 330 includes second-direction auxiliary flow paths 334a, periodically disposed between the second-direction flow paths 334, extending parallel to each other in the second direction. Accordingly, the first-direction flow paths 332 and the second-direction auxiliary flow paths 334a may intersect each other.

Figure 14:
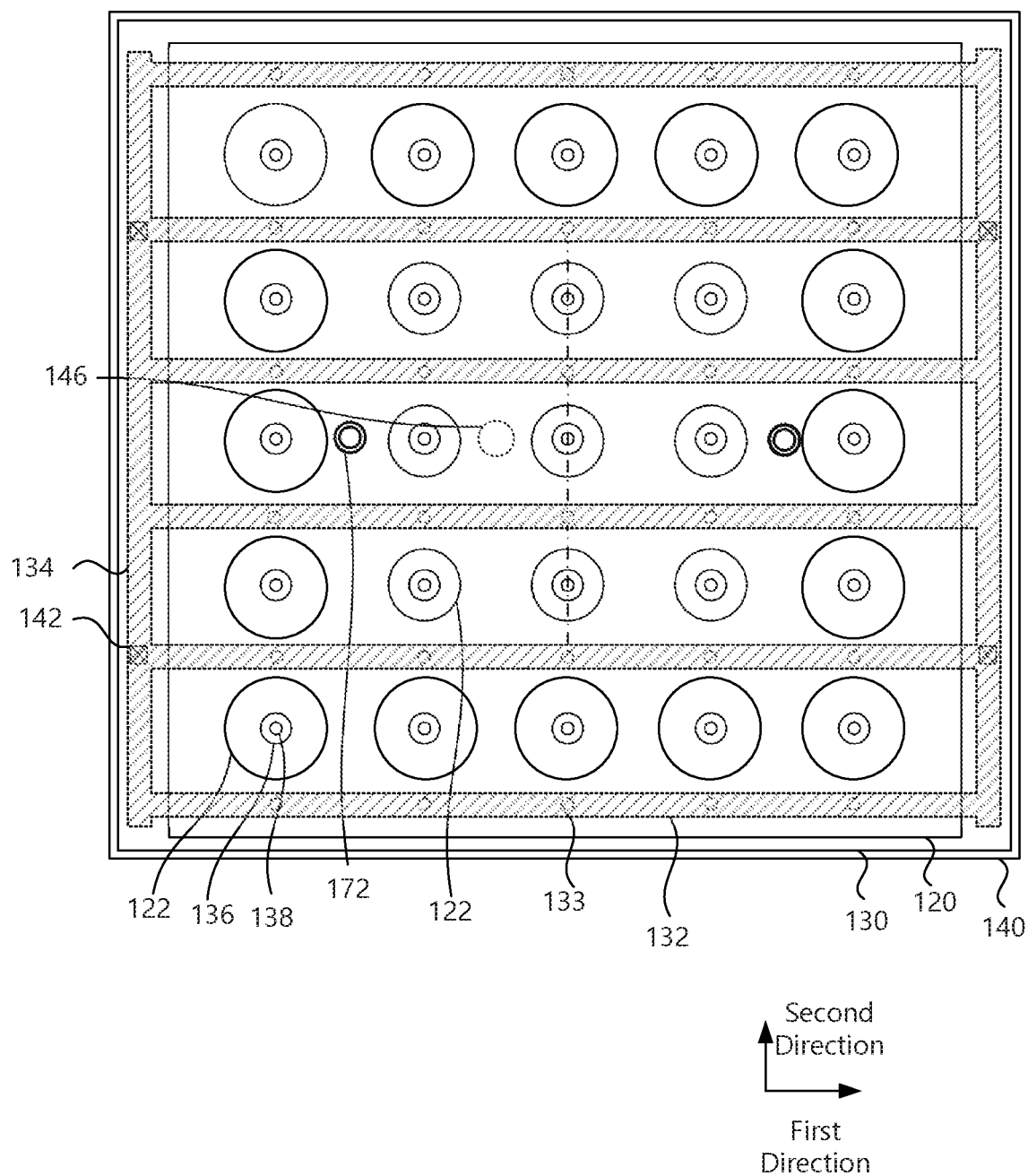
FIG. 14 is a plan view of a substrate processing apparatus according to another example embodiment of the present disclosure.

FIG. 14 is a plan view of a substrate processing apparatus according to another example embodiment of the present disclosure.

Referring to FIG. 14, a substrate processing apparatus 100c according to another example embodiment includes a first electrode 120 and a gas distribution portion 101. The first electrode 120 is disposed inside a chamber 110, receives radio-frequency (RF) power from an external component, and includes a plurality of openings 122 two-dimensionally arranged at regular intervals.

The gas distribution portion 101 includes first nozzles 138, penetrating through protrusions 136 protruding from a bottom surface to be respectively inserted into the opening 122 of the first electrode 120, and second nozzles 133 disposed on the bottom surface around each of the first nozzles 138. The gas injection portion 101 is disposed on the first electrode 120 to be spaced apart from the first electrode 120 by a constant interval and to form an auxiliary plasma space 131. The first nozzles 138 inject a first gas, and each of the protrusions 136 has an external diameter smaller than an internal diameter of the opening 122 of the first electrode 120. The second nozzles 333 inject a second gas, and the second gas, injected through the second nozzles 133, is injected through the opening 122 of the first electrode 120 after passing through the auxiliary plasma space 131 between the bottom surface of the gas distribution portion 101 and a top surface of the first electrode 120.

A cross section or a diameter of the first electrode 120 may vary depending on a position of a disposition plane. More specifically, among openings 122 of the first electrode 120 two-dimensionally arranged in a matrix, each opening 122 disposed on an outermost portion may have a diameter greater than a diameter of each opening disposed inside.

Figure 15:
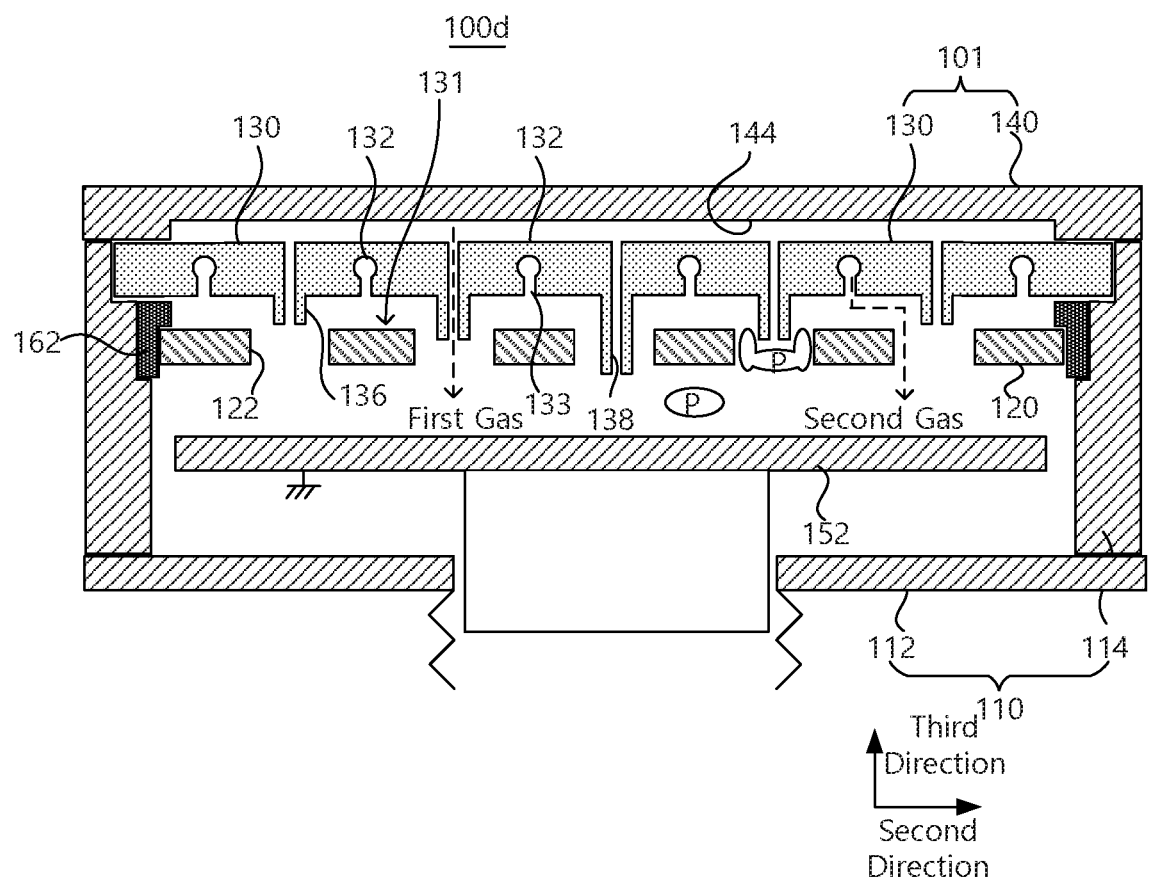
FIG. 15 is a cross-sectional view of a substrate processing apparatus according to another example embodiment of the present disclosure.

FIG. 15 is a cross-sectional view of a substrate processing apparatus according to another example embodiment of the present disclosure.

Referring to FIG. 15, a substrate processing apparatus 100d according to another example embodiment includes a first electrode 120 and a gas distribution portion 101. The first electrode 120 is disposed inside a chamber 110, receives radio-frequency (RI) power from an external component, and includes a plurality of openings 122 two-dimensionally arranged at regular intervals.

The gas distribution portion 101 includes first nozzles 138, penetrating through protrusions 136 protruding from a bottom surface to be respectively inserted into the opening 122 of the first electrode 120, and second nozzles 133 disposed on the bottom surface around each of the first nozzles 138. The gas injection portion 101 is disposed on the first electrode 120 to be spaced apart from the first electrode 120 by a constant interval and to form an auxiliary plasma space 131. The first nozzles 138 inject a first gas, and each of the protrusions 136 has an external diameter smaller than an internal diameter of the opening 122 of the first electrode 120. The second nozzles 333 inject a second gas, and the second gas, injected through the second nozzles 133, is injected through the opening 122 of the first electrode 120 after passing through the auxiliary plasma space 131 between the bottom surface of the gas distribution portion 101 and a top surface of the first electrode 120.

Lengths or output positions of the first nozzles 138 may be different from each other depending on a disposition plane. More specifically, an outlet of the first nozzle 138, disposed in a center region, may be disposed in the opening 122 of the first electrode 120, and an outlet of the first nozzle 138, disposed in an external region, may be disposed on a lower position than a bottom surface of the opening 122 of the first electrode 120.

When lengths or outlet positions of the first nozzles 138 are locally changed, a spatial distribution of plasma characteristics may be locally changed. Thus, a spatial layer-quality distribution and a thickness deviation, occurring in a large area, may be reduced.

As described above, a substrate processing apparatus according to an example embodiment of the present disclosure may simultaneously direct plasma and remote plasma to improve a thin-film deposition rate and thin-film characteristics.

Although the present disclosure and its advantages have been described in detail, it should be understood that various changes, substitutions and alterations can be made herein without departing from the spirit and scope of the disclosure as defined by the following claims.

What is claimed is:

1. A substrate processing apparatus comprising: a first electrode inside a chamber, receiving radio-frequency (RF) power from an external component and having a plurality of openings two-dimensionally arranged at regular intervals; a gas injection portion including first nozzles, penetrating through a protrusion protruding from a bottom surface respectively in the openings, and second nozzles, on the bottom surface around each of the first nozzles, wherein the gas injection portion is on the first electrode and spaced apart from the first electrode by a constant interval to form an auxiliary plasma space, and a gap between the openings and the protrusion, the gas injection portion is grounded, the gas injection portion includes a first gas distribution portion and a second gas distribution portion, the second gas distribution portion includes a plurality of first-direction flow path holes on the first electrode, extending parallel to each other in a first direction, and a pair of second-direction flow path holes connecting opposite ends of the first-direction flow path holes, the first gas distribution portion is on the second gas distribution portion, a gas buffer space is provided between a bottom surface of the first gas distribution portion and a top surface of the second gas distribution portion, the openings of the first electrode are between adjacent first-direction flow path holes at regular intervals in the first direction, the gas buffer space is connected to the first nozzles, and each of the first-direction flow path holes is periodically connected to the second nozzles in the first direction; a gas feeding path penetrating through an edge of the first gas distribution portion to be connected to the second-direction flow path holes; and a radio-frequency (RF) power supply line vertically penetrating through the gas distribution portion between a pair of adjacent first nozzles aligned in the first direction to be connected to the first electrode and to supply RF power to the first electrode, wherein the first nozzles inject a first gas, each of the first nozzles has an external diameter smaller than an internal diameter of the opening of the first electrode, and the second nozzles inject a second gas through the opening of the first electrode after passing through the auxiliary plasma space between the bottom surface of the gas injection portion and the first electrode.

2. The substrate processing apparatus as set forth in claim 1, further comprising: an insulating spacer covering the edge of the first electrode, coupled to a sidewall of the chamber, and between the first gas distribution portion and the second electrode to maintain a constant interval.

3. A substrate processing apparatus comprising: a first electrode inside a chamber, receiving radio-frequency (RF) power from an external component and having a plurality of openings two-dimensionally arranged at regular intervals; a gas injection portion including first nozzles, penetrating through a protrusion protruding from a bottom surface respectively in the openings, and second nozzles, on the bottom surface around each of the first nozzles, and on the first electrode and spaced apart from the first electrode by a constant interval to form an auxiliary plasma space, a gap between the openings and the protrusion, wherein the gas injection portion is grounded, the gas injection portion includes a first gas distribution portion and a second gas distribution portion, the first gas distribution portion includes a plurality of first-direction flow path holes, disposed on the first electrode, extending parallel to each other in a first direction, and a pair of second-direction flow path holes connecting opposite ends of the first-direction flow path holes, the first gas distribution portion is on the second gas distribution portion, a gas buffer space is between a top surface of the second gas distribution portion and a bottom surface of the first gas distribution portion, the openings of the first electrode are on the first-direction flow path holes at regular intervals, the gas buffer space is connected to the first nozzles, and each of the first-direction flow path holes is periodically connected to the first nozzles in the first direction; a gas feeding path penetrating through an edge of the first gas distribution portion to be connected to the second-direction flow path holes; and a radio-frequency (RF) power supply line vertically penetrating through the gas distribution portion between a pair of adjacent first nozzles aligned in the first direction to be connected to the first electrode and to supply RF power to the first electrode, wherein the first nozzles inject a first gas, the first nozzle has an external diameter smaller than an internal diameter of the opening of the first electrode, and the second nozzles inject a second gas through the opening of the first electrode after passing through the auxiliary plasma space between the bottom surface of the gas injection portion and the first electrode.

\* \* \* \* \*